US009373622B2

(12) United States Patent
Yin et al.

(10) Patent No.: US 9,373,622 B2
(45) Date of Patent: Jun. 21, 2016

(54) CMOS DEVICE WITH IMPROVED ACCURACY OF THRESHOLD VOLTAGE ADJUSTMENT AND METHOD FOR MANUFACTURING THE SAME

(71) Applicant: INSTITUTE OF MICROELECTRONICS, CHINESE ACADEMY OF SCIENCES, Beijing (CN)

(72) Inventors: Huaxiang Yin, Beijing (CN); Hong Yang, Beijing (CN); Qingzhu Zhang, Beijing (CN); Qiuxia Xu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/721,386

(22) Filed: May 26, 2015

(65) Prior Publication Data
US 2016/0086946 A1    Mar. 24, 2016

(30) Foreign Application Priority Data

Sep. 19, 2014    (CN) .......................... 2014 1 0484407

(51) Int. Cl.
  *H01L 21/8238*    (2006.01)
  *H01L 27/092*    (2006.01)
(52) U.S. Cl.
  CPC ...... *H01L 27/092* (2013.01); *H01L 21/823828* (2013.01); *H01L 27/0924* (2013.01)
(58) Field of Classification Search
  None
  See application file for complete search history.

(56) References Cited

U.S. PATENT DOCUMENTS 8,367,558 B2 * 2/2013 Xu ..................... H01L 21/28088
257/213

(Continued)

OTHER PUBLICATIONS

Han, K., et. al., "Metal Gate Work Function Modulation by Ion Implantation for Multiple Threshold Voltage FinFET Devices", Ext. Abs. The 13th International Workshop on Junction Technology 2013, pp. 104-106.*

*Primary Examiner* — Joseph Schoenholtz
(74) *Attorney, Agent, or Firm* — Drinker Biddle & Reath LLP

(57) ABSTRACT

An CMOS device comprises a plurality of NMOS transistors and a plurality of PMOS transistors, each of which comprises a gate stack constituted of a gate insulating layer and a gate metal layer on a substrate, a source/drain region in the substrate on both sides of the gate stack and a channel region below the gate stack, wherein the gate metal layer of each NMOS transistor comprising a first barrier layer, an NMOS work function adjusting layer, a second barrier layer, and a filling layer, and wherein the gate metal layer of each PMOS transistor comprising a first barrier layer, a PMOS work function adjusting layer, an NMOS work function adjusting layer, a second barrier layer, and a filling layer, and wherein the first barrier layer in the gate metal layer of the NMOS transistor and the first barrier layer in the gate metal layer of the PMOS transistor contain a doping ion to finely adjust the work function. The semiconductor device and the method for manufacturing the same according to the present disclosure utilize the sacrificial layer to diffuse impurity to the barrier layer so that the adjusting accuracy of the threshold voltage may be effectively improved, thereby facilitating in improving the whole performance of the device.

9 Claims, 5 Drawing Sheets

(56) References Cited

U.S. PATENT DOCUMENTS 8,987,080 B2 * 3/2015 Lu ..................... H01L 29/66477
257/E21.177

2014/0027857 A1 * 1/2014 Yin ....................... H01L 27/088
257/368
2015/0179640 A1 * 6/2015 Kim ..................... H01L 29/517
257/392

* cited by examiner

NMOS   PMOS

NMOS   PMOS

NMOS   PMOS

CMOS DEVICE WITH IMPROVED ACCURACY OF THRESHOLD VOLTAGE ADJUSTMENT AND METHOD FOR MANUFACTURING THE SAME

CROSS-REFERENCE TO RELATED APPLICATION(S)

This application claims priority to a Chinese Application No. 201410484407.6, filed on Sep. 19, 2014, entitled "CMOS DEVICE AND METHOD FOR MANUFACTURING THE SAME", which is incorporated herein by reference in their entirety.

FIELD OF INVENTION

The present disclosure relates to a semiconductor device and a method for manufacturing the same, and in particular, to a metal gate structure of a CMOSFET device and a method for manufacturing the same.

BACKGROUND OF THE INVENTION

From the 45 nm process for a CMOS integrated circuit, as the feature size of the device is continuously shrinking, an equivalent oxide thickness (EOT) of a gate insulating dielectric layer needs to be reduced synchronously so as to suppress a short channel effect. However, an ultrathin conventional oxide layer or oxide nitride layer will leads to a serious gate leakage. Therefore, the conventional structure of a polycrystalline silicon/SiON gate stack cannot be applied to a device with a small size.

One solution employs a conventional planar CMOS dual-metal gate integrating process and its typical manufacturing method is as follows: dummy gate stack structures are formed in a PMOS region and a NMOS region, respectively; gate spacers are formed on a substrate on both sides of the dummy gate stack structures and a source/drain region are formed on the substrate; an interlayer dielectric layer (ILD) is spin coated on the whole device; the dummy gate stack, structures are selectively removed; and gate trenches are formed in the PMOS region and the NMOS region, respectively; a liner layer (IL) of silicon oxide and a gate insulating layer with a high dielectric constant (HK) are deposited in all the gate trenches; a first barrier layer (BR1) of TiN, an etching stop layer of TaN and a PMOS work function metal layer of TiN are formed by deposition in turn on the gate insulating layer in all of the gate trenches; the PMOS work function metal layer of TiN in the NMOS region is selectively removed by etching until being stopped at the etching stop layer of TaN or the first barrier layer of TiN; an NMOS work function metal layer of TiAl, a third barrier layer of TiN or Al, and a filling layer of Al or W are deposited in turn on the whole device; the CMP planarization is performed until the ILD is exposed; and then a source/drain contact holes are etched to accomplish an electrical connection of the device. During this process, since the work function layer of the NMOS region is TiAl in which the Al ions facilitate a rapid diffusion and may effectively diffuses to proximity of an interface of HK/BR1, it may effectively control the work function of the NMOS region. However, such a process in which a plurality of stack layers are deposited and then selectively removed leads to an excessive number of thin films stacked in the PMOS region and leads to an over-complex gate structure. In case of the length of gate is reduced, a space for the filling layer with a lower resistance is decreased and may lead to issues such as an uneven filling, formation of cavity, or the like. In addition, when devices with different thresholds are formed by adjusting the plurality of NMOS and PMOS regions; a conventional technical solution is to adjust the thickness of the first barrier layer BR1 of TiN or that of the etching stop layer of Ta or TaN, or the thickness and material characteristics of the work function layer, or to select an appropriate annealing temperature of the metal gate. However, the adjusting accuracy of the thickness by these adjusting processes cannot be effectively improved due to the continuous shrinking of the device size, and the process cost caused by material are higher and makes against mass production of the devices.

Another technical solution for suppressing the short channel effect is to employ a FinFET (Fin Field Effect Transistor) and the steps of its typical manufacturing method are shown as follows: a substrate is etched to form a plurality of fins and trenches between the fins extending along a first direction; an insulating dielectric is filled and etched back in the trenches between the fins so as to form a shallow trench isolation (STI); a dummy gate stack structure extending along a second direction is formed on the FIN structure exposing the STI; gate spacers and a source/drain region are formed on both sides of the dummy gate stack structure along the first direction; an interlayer dielectric layer (ILD) is deposited to cover the whole device; the dummy gate stack is selectively removed to leave a gate trench in the ILD layer; and a gate stack structure of HK/MG is deposited in turn in the gate trench. Such a device structure effectively implements a device with a small size and maintains the electrical characteristic of the original design by a 3D channel. However, the integration process of the metal gate for the FinFET continues employing a planar structure and planar integrating method, and the formation of a 3D channel results in the linewidth of the gate length of the gate trench and the HK/MG gate stack formed by filling the gate trench continues to be decreased and its depth-width ratio continues to be increased. Therefore, the issue of filling metal becomes increasingly important for the next generation of device integration. It is in a great need of a new method or new structure to improve the filling ratio of the metal gate for the device with a small size. In addition, since the doping concentration of the channel region formed below the gate stack by utilizing a Fin structure in the FinFET is lower, a conventional manner of adjusting the threshold voltage by the doping of channel is not applicable any longer. There is a difficulty in accurately adjusting and controlling the threshold voltage of the FinFET. Furthermore, in a developing trend of the thickness of the metal gate and the simplifying of the structure, it is increasingly difficult to adjust the work function or threshold values by simply changing thickness of the work function layer or the barrier layer.

SUMMARY OF THE INVENTION

As mentioned above, the object of the present disclosure is to overcome the above mentioned technical difficulties and to propose a novel CMOS metal gate structure and a method for manufacturing the same so as to effectively improve the adjusting accuracy of threshold voltage.

Thus, the present disclosure provides a CMOS device comprising a plurality of NMOS transistors and a plurality of PMOS transistors, each of which comprises a gate stack constituted of a gate insulating layer and a gate metal layer on a substrate, a source/drain region in the substrate on both sides of the gate stack, and a channel region below the gate stack, wherein the gate metal layer of each NMOS transistor comprising a first barrier layer, an NMOS work function adjusting layer, a second barrier layer, and a filling layer, and wherein the gate metal layer of each PMOS transistor comprising a first barrier layer, a PMOS work function adjusting layer, an NMOS work function adjusting layer, a second barrier layer, and a filling layer, and wherein the first barrier layer in the gate metal layer of the NMOS transistor and the first barrier layer in the gate metal layer of the PMOS transistor contain a doping ion to finely adjust the work function.

In an embodiment, the material for the first and/or second barrier layer and/or the PMOS work function adjusting layer may be TiN.

In an embodiment, the material for the NMOS work function adjusting layer may comprise one of TiC, TiAl, and TiAlC or any combination thereof.

In an embodiment, the gate metal layers in each NMOS transistor and each PMOS transistor may further comprise an etching stop layer on top of the first barrier layer.

In an embodiment, the doping ions contained in the first barrier layer may be selected from a group consisting of B, Al, Ga, C, Be, Ca, As, P, N, Ge, Sb, Se, and Te, or any combination thereof.

In an embodiment, the doping ion in the first barrier layers of the NMOS transistor and the PMOS transistor result in that the work function shifts towards one of a conduction band and a valence band, or that the work functions of the NMOS transistor and the PMOS transistor shift towards different directions or by different amounts.

The present disclosure further provides a method for manufacturing a CMOS device, comprising steps of: forming a plurality of NMOS gate trenches and a plurality of PMOS gate trenches on a substrate; forming a gate insulating layer in each NMOS gate trench and each PMOS gate trench; forming a first barrier layer, an etching stop layer, and a sacrificial layer containing a dopant in turn on the gate insulating layer in the plurality of NMOS gate trenches and the plurality of PMOS gate trenches; performing an annealing to force the dopants in the sacrificial layer at least partially into the first barrier layer; selectively removing the sacrificial layer in the plurality of NMOS gate trenches and the plurality of PMOS gate trenches by etching; selectively depositing a PMOS work function adjusting layer in the plurality of PMOS gate trenches; and forming an NMOS work function adjusting layer, a second barrier layer, and a filling layer in turn in the plurality of NMOS gate trenches and the plurality of PMOS gate trenches.

In an embodiment, the material for the sacrificial layer may be selected from a group consisting of polycrystalline silicon, amorphous silicon, amorphous germanium, SiGe, Si:C, and Si:H, or any combination thereof.

In an embodiment, the material for the first and/or second barrier and/or the PMOS work function adjusting layer may be TiN.

In an embodiment, the material for the NMOS work function adjusting layer may comprise one of TiC, TiAl, and TiAlC or any combination thereof.

In an embodiment, the step of depositing a PMOS work function adjusting layer may specifically comprise steps of: depositing a PMOS work function adjusting layer in the plurality of NMOS gate trenches and the plurality of PMOS gate trenches; covering the plurality of PMOS gate trenches by a photoresist pattern; and removing the exposed PMOS work function adjusting layer in the plurality of NMOS gate trenches by etching until the etching stop layer is exposed or the etching stop layer is over etched.

In an embodiment, the step of depositing a PMOS work function adjusting layer may specifically comprise steps of: covering the plurality of NMOS gate trenches by a photoresist pattern; and depositing a PMOS work function adjusting layer on the exposed etching stop layer in the plurality of PMOS gate trenches.

In an embodiment, the doping ion contained in the first barrier layer may be selected from a group of B, Al, Ga, C, Be, Ca, As, P, N, Ge, Sb, Se, and Te, or any combination thereof.

In an embodiment, the step of forming a sacrificial layer containing a dopant may comprise steps of: depositing a sacrificial layer on the etching stop layer, and selectively ion implanting different dopants into the plurality of NMOS gate trenches and the plurality of PMOS gate trenches; or depositing a sacrificial layer containing a dopant in situ by introducing a different raw doping gas when the sacrificial layer is deposited.

In an embodiment, the doping ion in the first barrier layer of the NMOS transistor and the PMOS transistor result in that the work function shifts towards one of a conduction band and a valence band, or that the work functions of the NMOS transistor and the PMOS transistor shift towards different directions or by different amounts.

The semiconductor device and the method for manufacturing the same according to the present disclosure utilizes the sacrificial layer to diffuse impurity to the barrier layer such that the adjusting accuracy of the threshold voltage may be effectively improved, thereby facilitating in improving the whole performance of the device.

BRIEF DESCRIPTION OF THE DRAWINGS

The technical solutions of the present disclosure will be illustrated in detail with reference to the accompany figures, in which.

DETAILED DESCRIPTION OF PREFERRED EMBODIMENTS

The characteristic and effect of the present disclosure would be illustrated in detail by referring to the accompany figures and in conjunction with the embodiments. The present disclosure discloses a semiconductor device and a method for manufacturing the same which effectively improves the filling rate of the metal gate and effectively adjusts the work function of the metal. It should be noted that similar reference signs refer to similar structure. The terms such as "first", "second", "upper", "lower" or the like are used to illustrate the respective device structures or the manufacturing procedures. Unless there is specially stated, those terms do not indicate the relationship of the device structure and manufacturing procedure in space, order or rating.

Figure 3A:
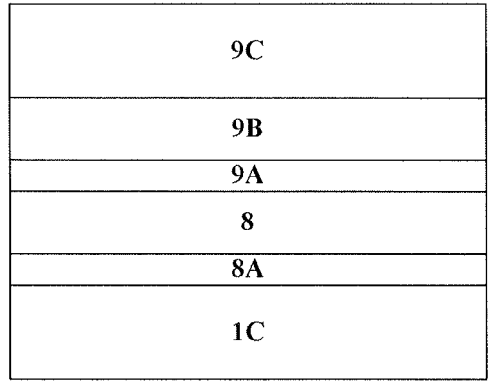
FIG. 3A-FIG. 3F are schematic enlarged views of the steps shown in FIG. 2.
Figure 3A:
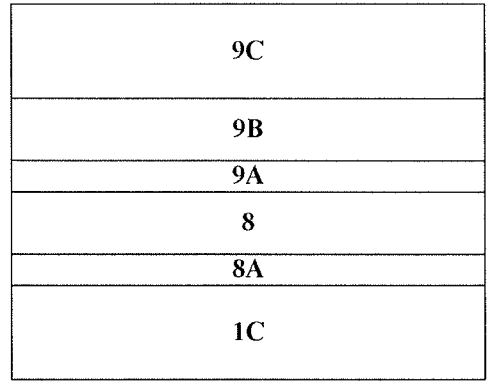
Figure 3B:
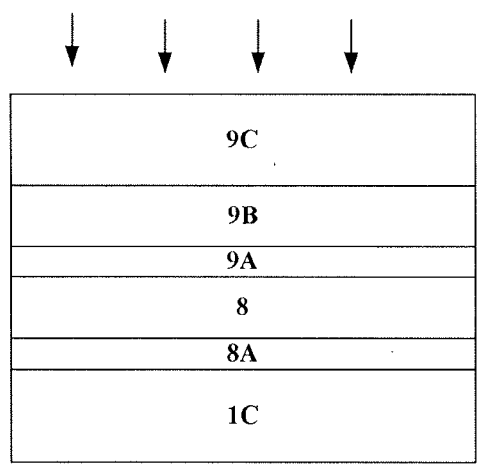
Figure 3B:
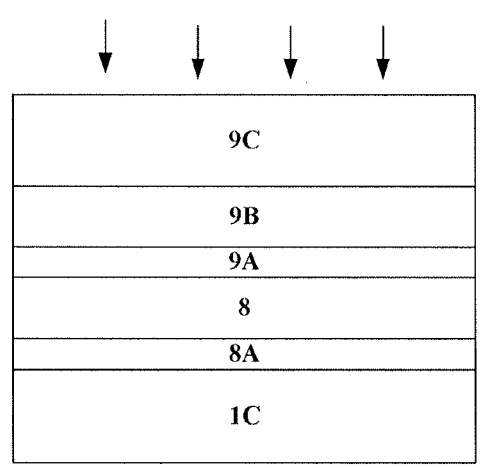
Figure 3C:
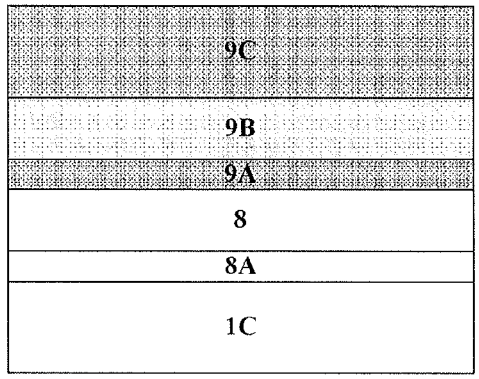
Figure 3C:
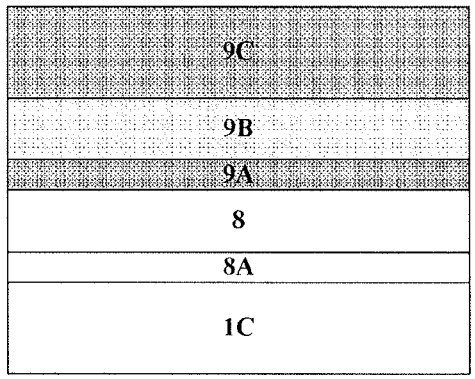
Figure 4:
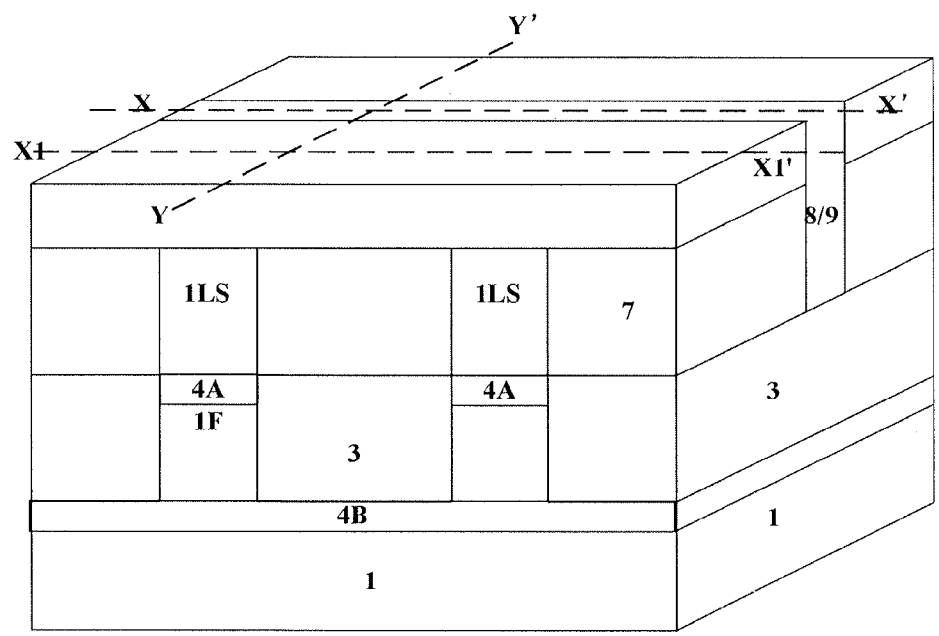
FIG. 4 is a perspective view of the FinFET device according to the present disclosure.

It should be noted that the upper portions in the respective figures show sectional views of the device along a first direction in FIG. 4 (the extending direction of the Fin and the extending direction of the source/drain regions, i.e. Y-Y' axis line). The middle portions show sectional views of the device along the central line of the gate stack in a second direction (the extending direction of the gate stack perpendicular to the first direction, i.e. X-X' axis line). The lower portions show sectional views of the device at a position parallel to the second direction and outside of the gate stack (there is a certain distance therebetween in the first direction). Moreover, it should be noted that the embodiment and figures of the present disclosure only show a process for manufacturing a FinFET device, but in other embodiments of the present disclosure, the integration process for the metal gate disclosed by the present disclosure (by referring to FIG. 3A-FIG. 3C) may be applicable to a planar CMOS device.

Figure 1:
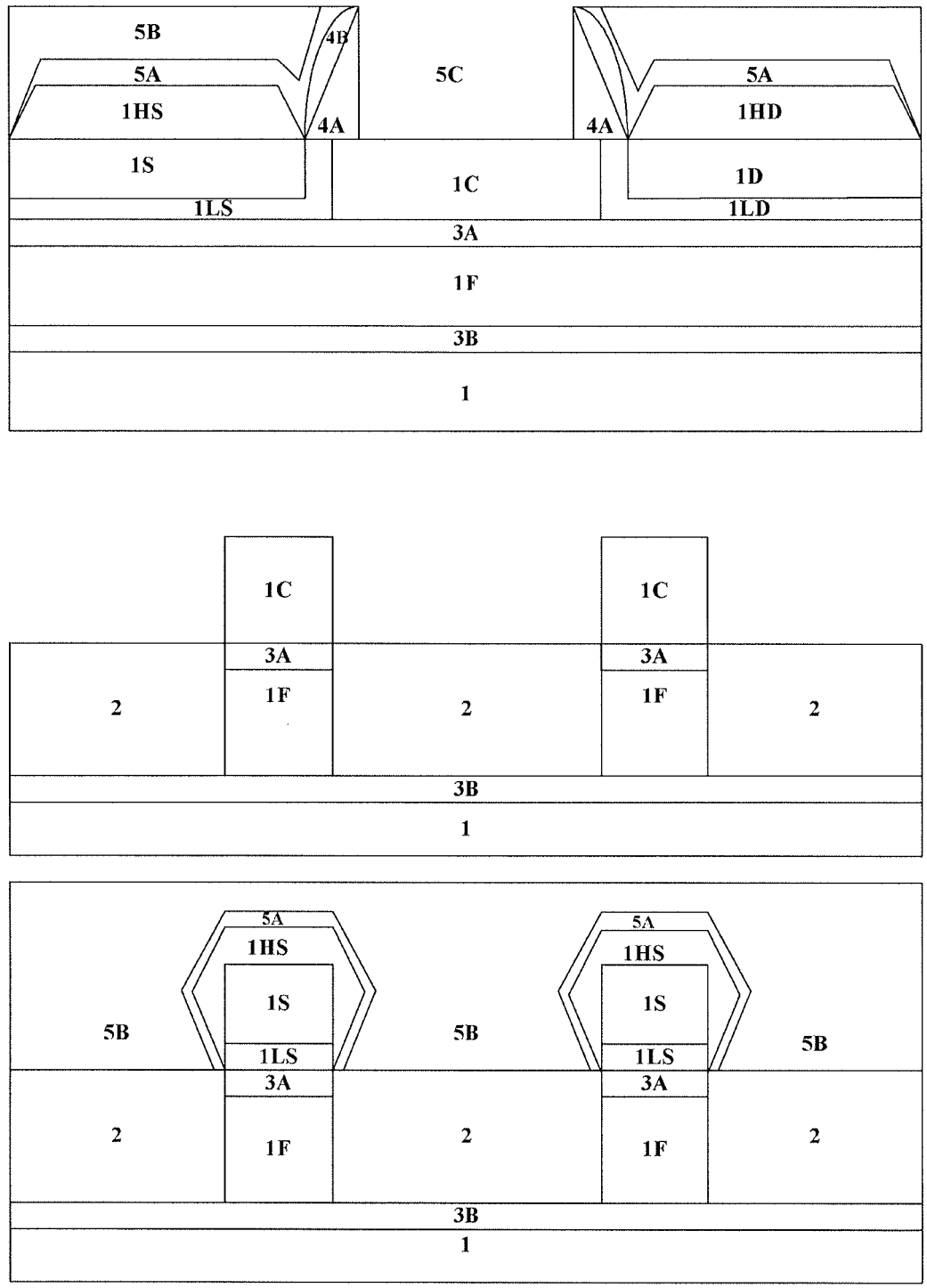
FIG. 1 and FIG. 2 are schematic views of various steps of a method for manufacturing a FinFET according to the present disclosure.

As shown in FIG. 1, a plurality of gate trenches are formed on a substrate 1, including a PMOS gate trench in a PMOS region and an NMOS gate trench in an NMOS region.

In particular, a plurality of fin structures 1F extending along a first direction and trenches between the fin structures are formed on the substrate 1. The first direction is an extending direction of a channel region of the device in future (the Y-Y' axis line in FIG. 4). The substrate 1 is provided. The substrate 1 may be appropriately selected according to the usage of the device and may comprise any of monocrystalline bulk silicon (Si), a monocrystalline bulk germanium (Ge), a strained silicon (Strained Si), silicon germanium (SiGe), a semiconductor compound material (such as Gallium Nitride (GaN), Gallium Arsenide (GaAs), Indium Phosphide (InP), Indium Antimonide (InSb)), or a carbon-based semiconductor (such as Graphene, SiC, Carbon nanotube, or the like). In consideration of the compatibility with a CMOS process, the substrate 1 is preferably bulk silicon. Alternatively, a hard mask layer (not shown) is formed on the substrate 1, for example, a silicon nitride or silicon oxynitride layer formed by a process such as LPCVD, PECVD, sputtering, or the like. A photoresist is applied on the hard mask layer and is exposed and developed to form a photoresist pattern (not shown). The hard mask layer is etched to form a hard mask pattern by taking the photoresist pattern as a mask, and the substrate 1 is further etched by further taking the hard mask pattern as a mask, so as to form a plurality of trenches extending parallel along a first direction and fins 1F composed of the remaining portion of the substrate 1 between the trenches. Preferably, the etching is an anisotropic etching, such as a plasma dry etching, reactive ion etching (RIE), or Tetramethylammonium hydroxide Beilstein (TMAH) wet etching, so that a depth-width ratio of the trench 1G is preferably greater than 5:1. A width of the fin 1F in a second direction is, for example, only 5-50 nm, and preferably ranging from 10-20 nm.

An isolating dielectric layer 2 is formed on the fin structure 1F and the substrate 1. For example, an insulating isolation dielectric layer 2 is formed in the trenches between the fins 1F by depositing a filling material such as silicon oxide, silicon oxynitride, silicon hydroxide, organic substances or the like by a process such as PECVD, HDPCVD, RTO (rapid thermally oxidation), spin coating, FlowCVD and so on. Preferably, the layer 2 is processed by a planarization process such as CMP, Etch-back or the like until the hard mask layer is exposed.

Preferably, a punch through stop layer (PTSL) 4 is formed in the Fin 1F and/or at the bottom. After the hard mask layer is exposed by planarization, an ion implantation is performed, and the implanted ions may comprise any of N, C, F, P, Cl, As, B, In, Sb, Ga, Si, and Ge or any combination thereof. Subsequently, an annealing is performed, for example, thermal processing at a temperature of about 500-1200 Celsius degrees for about 1 ms-10 min, so that the implanted element reacts with the Fin 1F to form a highly doped (the Si doped with the above mention materials) or insulating (e.g. doped with the silicon oxide in the above mentioned materials) punch through stop layer 3. In one embodiment of the present disclosure, the implanting energy and implanting dosage are controlled to form a channel punch through stop layer 3A only in the Fin 1F, so as to suppress the leakage from the channel region through the side surface of the STI region.

However, in another preferred embodiment of the present disclosure, the implanting energy and implanting dosage are controlled so that the punch through stop layer 3 is further distributed at an interface between the bottom of the Fin 1F and the substrate 1 as a STI punch through stop layer 3B, so as to effectively isolate an leakage current between the channel region and source/drain regions in the Fin 1F and the active regions of the adjacent Fins. The material for the layer 3B may be identical to that of the layer 3A, and may also contain different component from the above mentioned elements (but at least containing oxygen). The layer 3B and the layer 3A may be synchronously formed by one implantation (the implantation depths for different elements are different from each other), and may also be formed by two implantation steps with different depths and dosages. For example, the layer 3B is formed by an implantation with a deeper depth and then the layer 3A is formed by an implantation with a shallower depth, and vice versa. In addition, in addition to the highly doped punch through stop layer as mentioned above, an amount of oxygen (O) may be implanted to form a silicon oxide based insulating layer as the punch through stop layer (the silicon oxide layer may be further doped with the above mentioned impurity). It should be noted that the distance from the channel punch through stop layer 4A to the top (or bottom) of the Fin 1F may be arbitrarily set. In one embodiment of the present disclosure, it is preferably set to be ⅓-½ of height of the Fin 1F itself. For example, the thickness of the STI punch through stop layer 3B and the channel punch through stop layer 3A may range from 5-30 nm. The width of the layer 3B (along the first and/or second direction) may be set according to the width of the active region of the whole device and the width of the layer 3A is identical to that of the Fin 1F. That is, the width of the layer 3B is obviously larger than that of the layer 3A.

The isolating layer 2 is selectively etched to form a trench again and to expose one portion of the Fin 1F. The isolating layer 2 is etched by selecting an anisotropic etching such as plasma dry etching or RIE and by utilizing the photoresist pattern or other hard mask pattern, so that the remaining part of the isolating layer 2 constitutes a shallow trench isolation (STI) region 2. Preferably, the depth of the trench, i.e. the distance from to the top of the STI region 2 to the top of the Fin 1F, is greater than or equal to the distance from the top of the channel punch through stop layer 3A to the top of the Fin 1F, so as to completely suppress the punching through between the channel regions. Subsequently, the hard mask is removed by a wet etching.

A dummy gate stack extending along a second direction is formed on top of the Fin 1F A dummy gate insulating layer and a dummy gate material layer is formed on the whole device by a process such as LPCVD, PECVD, HDPCVD, UHVCVD, MOCVD, MBE, ALD, thermal oxidation, chemical oxidation, evaporating, or sputtering; and preferably, a hard mask layer is also formed. For example, the dummy gate insulating layer may be a layer of silicon oxide, the dummy gate material layer may be a layer of polycrystalline silicon, amorphous silicon, amorphous carbon, silicon nitride or the like, and the hard mask layer may be a layer of silicon nitride. By taking a mask with a rectangular opening along a second direction perpendicular to the first direction, the hard mask layer, the dummy gate material layer, and the dummy gate insulating layer are processed by photolithography/etching (as such, the etching may be anisotropic, preferably such as plasma dry etching, RIE), so as to form a dummy gate stack extending along the second direction on top of the Fin 1F. The dummy gate stack is only distributed in a certain range of the width along the axis line X-X', and there is no dummy gate stack at the axis line X1-X1' beyond the certain range.

A first gate spacer 4A is formed on the whole device. An insulating material layer 4 is formed on the whole device by a process such as LPCVD, PECVD, HDPCVD, UHVCVD, MOCVD, MBE, ALD, Evaporation, (magnetron) sputtering, or the like. The material for the insulating material layer 4 may be silicon nitride, silicon oxynitride, silicon oxide, carbon-containing silicon oxide, amorphous carbon, or Diamond-like amorphous carbon (DLC), or any combination thereof. In one embodiment of the present disclosure, silicon nitride is preferred. Subsequently, an anisotropic etching is utilized to etch the insulating material layer 4 and only first gate spacers 4A are left on both sides of the dummy gate stack along the first direction. It should be noted that although the first gate spacer 4A as shown in the figure is of a triangle shape, in another preferred embodiment of the present disclosure, the spacer 4A is preferably has an L shape, i.e. having a first horizontal portion and a second vertical portion, so as to better conform to the dummy gate stack and to reduce the thickness of the gate spacer 4A, as to further decrease the device size and to improve the uniformity of the device. In one preferred embodiment, the thickness of the layer 4A is only, for example, 1-5 nm, preferably 2-4 nm, and the most optimally 3 nm. The layer 4A defines the width of lateral diffusion in the subsequent SDE doping process and protects the top of the Fin to reduce the defects.

The Fin structure 1F is selectively etched to form a trench for the source/drain regions (not shown) in the Fin 1F on both sides of the dummy gate stack along the first direction. Preferably, an anisotropic etching is utilized, such as plasma dry etching, RIE etching, and the proportion of the etching gases are adjusted (i.e. the fluorocarbon ratio in the fluorocarbon based etching gas may be increased to facilitate to form a vertical sidewall, and the oxidized gas component contained in the etching gas may be adjusted to adjust the etching speed). By taking the dummy gate stack structure and the gate spacer 4A as a mask, the Fin structure 1F is etched to form a trench for the source/drain regions. Preferably, the depth of the trench in the source/drain region is smaller than the height of the fin structure 1F at top of the punch through stop layer 3A. For example, a horizontal portion of the fin structure 1F with a thickness of about 5-30 nm at least is remained on top of the punch through layer 3A; the fin structure 1F below the stack of the gate 4A and the dummy gate stack structure is reserved and functions as a channel region 1C of the device subsequently. In one preferred embodiment of the present disclosure, in addition to an anisotropic etching process being employed to form a trench for the source/drain regions having a vertical sidewall, an isotropic etching process (for example, by decreasing the fluorocarbon ratio of the etching gas, or by employing a wet etching process such as TMAH, KOH, or the like) may be further employed to form a side recess (not shown) on the sidewall of the trench for the source/drain regions so as to enhance the stress control of the channel or to facilitate the accurate control of the channel interface or the like.

By taking the first gate spacer layer 4A and the dummy gate stack structure as a mask, the remaining portion of the Fin 1F reserved and exposed in the trench of the source/drain regions is lightly doped by ion implantation, so that a lightly doped source/drain regions (LDD structure or SDE structure) 1LS and 1LD are formed at the bottom and sidewalls of the trench 1T for the source/drain regions. The Fin 1F between them forms the channel region 1C. A vertical inclination angle (such an angle only refers to the numerical value of the minimum acute angle among a plurality of angles formed by the implantation direction and the vertical direction, and it does not represent any space orientation) may range from 0~65±0.5 degree. In one preferred embodiment of the present disclosure, the vertical inclination angle is increased so as to increase the lateral junction depth of the doped implantation ion in the lateral channel direction along the first direction; and the vertical inclination angle is decreased to increase the junction depth along the vertical direction. For example, in one embodiment of the present disclosure, the vertical inclination angle $\beta$ may be 30, 45 or 60 degrees. For example, the implantation energy may be 50-200 KeV, and preferably is 100 KeV. The implantation dosage may be $10^{14}$-$10^{16}$/cm$^2$, and preferably is $10^{15}$/cm$^2$. In another preferred embodiment of the present disclosure, a plurality of implantations with different parameters is utilized to form a LDD/SDE structure. For example, for the first time, an implantation with a small vertical inclination angle, a large implantation energy and/or implantation dosage is utilized to form a first doping region having a small lateral junction depth and a large longitudinal junction depth; for the second time, an implantation with a medium vertical inclination angle, a medium implantation energy and/or implantation dosage is utilized to form a second doping region having a medium lateral junction depth and a medium longitudinal junction depth; and for the third time, an implantation with a large vertical inclination angle, a small implantation energy and/or implantation dosage is utilized to form a third doping region having a large lateral junction depth and a small longitudinal junction depth, and so forth to obtain a distribution of the junction depth having a curved profile (or progressive changes) (which is different from a steep distribution of the junction depth formed by one-time implantation and it has a gradual change along the lateral and vertical directions of the first direction). Optionally, in addition to the implantation direction with a vertical inclination angle with respect to the vertical normal line, the implantation direction with respect to the first direction may form a horizontal angle (not shown in the figure, such an angle only refers to the numerical value of the minimum acute angle among a plurality of angles formed by the implantation direction and the horizontal direction, and it does not represent any space orientation). Furthermore, the lateral junction depth and uniformity of the LDD/SDE structure may be adjusted by adjusting the horizontal inclination angle. During the light doping and implantation process as mentioned above, since the doping ion is only implanted at a local region which is adjacent to the channel region 1C and the top of the Fin structure 1F, its thickness is small (under control of the depth of the trench for the source/drain region) and its impact on the subsequently epitaxial growth of the source/drain region is limited which facilitates in forming a uniform and lightly doped source/drain region with a shallow junction.

A source region 1S and a drain region 1D are epitaxially grown in the trench of the source/drain regions, and preferably raised source/drain regions are epitaxially grown on top of the source region 1S and the drain region 1D. For example, a drain region 1D and a raised drain region 1HD as well as a source region 1S and a raised source region 1HS are epitaxially grown on top of both sides of the trenches of the source/drain regions and the dummy gate stack on top of the Fin 1F along the first direction by a process such as PECVD, MOCVD, MBE, ALD, Thermal Decomposition, Evaporation, Sputtering, or the like. The material for the source/drain regions 1S/1D and the raised source/drain regions 1HS/HD may be identical to those of the substrate 1 and the Fin 1F, for example, Si. Those materials may also be different from each other, for example, SiGe, Si:C, Si:H, SiSn, GeSn, or SiGe:C or any combination thereof having a higher stress. During such a process, an in-situ doping or an ion implantation doping may be performed. Subsequently, a second gate spacer 4B is further formed on the first gate spacer 4A and its material and manufacturing process are similar to those for the first gate spacer. Subsequently, by taking the second gate spacer 4B as a mask, a second ion implantation and a heavily doping for the source/drain regions (the longitudinal junction depth is shallow) are performed so that the raised source/drain region 1 HD/1 HS has a doping concentration higher than those of the source/drain region 1S/1D and the lightly doped region 1LD/1LS. Subsequently, an annealing is performed to activate the doped impurity. At the same time, such an annealing further alleviates the damage to the top of the Fin structure and decreases the defects in the epitaxial layer caused by the implantation of the LDD/SDE, which facilitates in improving the reliability of the device by a simplified process. Being limited by the shape of the trench 1T for the source/drain region, the source/drain regions 1S/1D typically have a rectangular profile. Since the raised source/drain region s1HS/1HD are not limited by the shape of the trench 1T and only limited by different growing rates in different crystallographic orientations, the raised source/drain regions 1HS/1HD have a profile of a rhombus shape or a diamond shape.

A contact etching stop layer (CESL) 5A and an interlayer dielectric layer (ILD) 5B are formed on the whole device. Preferably, the contact etching stop layer 5A (which may be omitted) of silicon nitride may be formed on the device by a process such as PECVD, HDPCVD, Sputtering, or the like. Subsequently, an ILD 5B of a silicon oxide or low-k material may be formed by a process such as spin coating, spray coating, screen printing, CVD, PVD, or the like. The low-k material includes but not limited to an organic low-k material (e.g. an organic polymer containing aryl group or polycyclic), an inorganic low-k material (e.g. a thin film of amorphous carbon-nitrogen, a thin film of polycrystalline boron-nitrogen, fluorinated silicate glass, BSG, PSG, BPSG), or a porous low-k material (e.g. Silsesquioxane (SSQ) based porous low-k material, a porous silicon dioxide, a porous SiOCH, C-doped silicon dioxide, F-doped porous amorphous carbon, a porous diamond, or a porous organic polymer).

The ILD 5B and the hard mask layer is planarized by a process such as CMP or etching-back until the dummy gate material layer of the dummy gate stack is exposed. Subsequently, the dummy gate stack is removed to form a gate trench 5C. The dummy gate stack may be removed by utilizing a wet etching, e.g. a hot phosphoric acid for silicon nitride, TMAH for a polycrystalline silicon or amorphous silicon, a combination of a strong acid (sulfuric acid, nitric acid) and a strong oxidant (ozone, hydrogen peroxide) for amorphous carbon, DLC, or HF-based etching solution (dilute HF or BOE, the BOE being a sustained release etchant, a mixed solution of $NH_4F$ and HF) for silicon oxide, so that the dummy gate material layer and the dummy gate insulating layer are removed until the top of the Fin 1F is exposed. Moreover, an anisotropic dry etching (only along the X-X' axis line in the second direction) may be utilized to adjust the ratio of the fluorocarbon based gas so that the etching rate for the lower portion is larger than that for the sidewall portion (e.g. the etching ratio is greater than 5:1, and preferably 10:1-15:1). Thus, a gate trench 7C with a profile of a vertical sidewall may be formed by etching.

Figure 2:
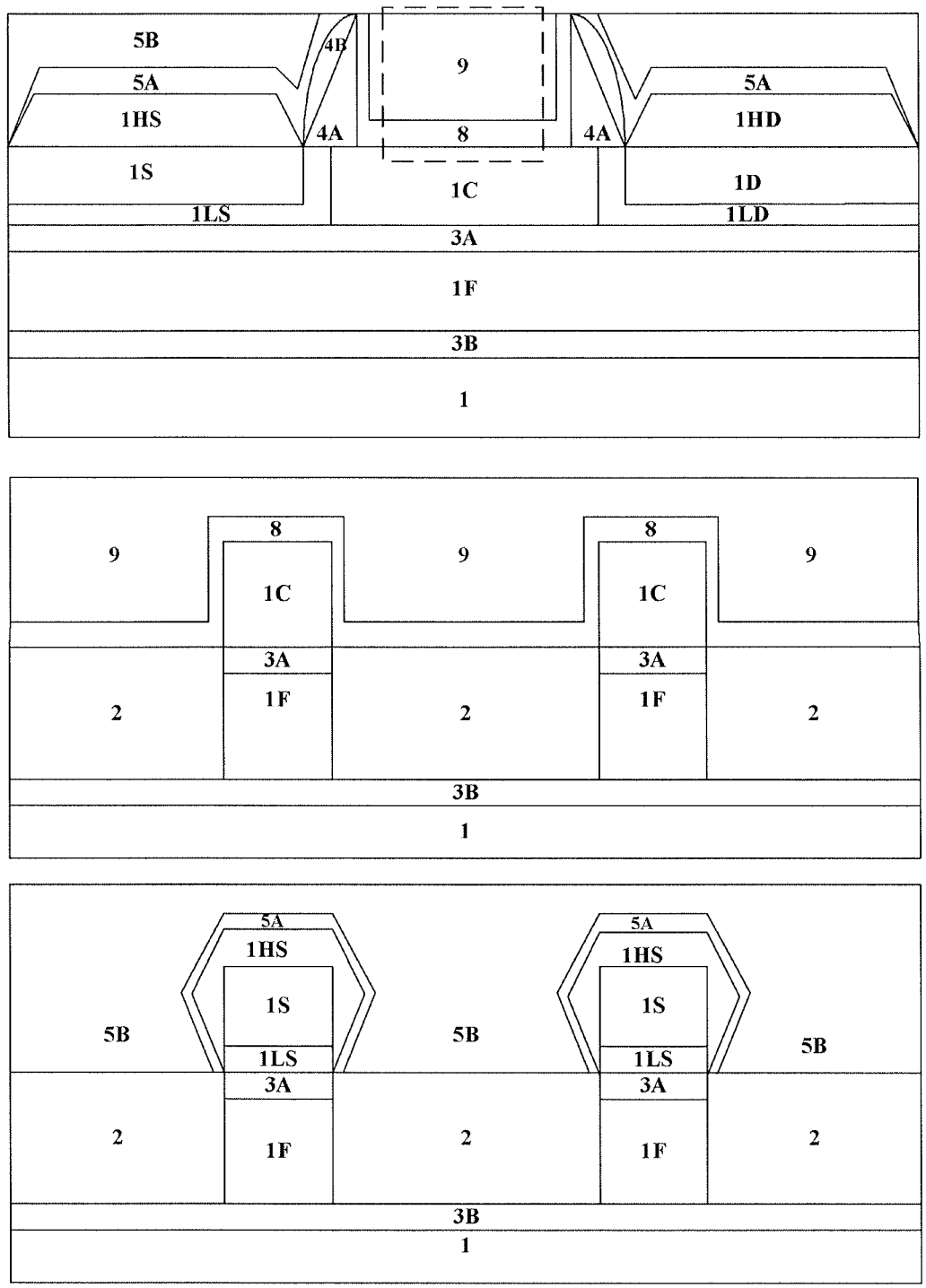

As shown in FIG. 2, the final gate stack is formed in the PMOS gate trench and the NMOS gate trench, respectively.

First of all, a gate insulating layer 8 is formed in the gate trench 5C by utilizing a process such as PECVD, HDPCVD, MOCVD, MBE, ALD, Evaporation, Sputtering or the like. Preferably, the gate insulating layer 8 is composed of a high-k material which includes but not limited to a hafnium-based material (in which the content of the oxygen atom x may be reasonably adjusted according to the ratio for the metal compositions and the chemical valence, for example, x may be 1-6 and is not limited to an integer number) selected from a group comprising $HfO_2$, $HfSiO_x$, HfSiON, $HfAlO_x$, $HfTaO_x$, $HfLaO_x$, $HfAlSiO_x$, and $HfLaSiO_x$, or a rare earth element-based high-k dielectric material selected from a group comprising $ZrO_2$, $La_2O_3$, $LaAlO_3$, $TiO_2$, and $Y_2O_3$, or $Al_2O_3$, or a composite layer of the above mentioned materials. Optionally and as shown in the subsequent FIG. 3A, a liner layer 8a of a silicon oxide material is deposited preferably by a process such as thermal oxidation, Chemical oxidation, PECVD, HDPCVD, MBE, ALD, or the like before a gate insulating layer 8 is formed, so as to alleviate the interfacial defect between the gate insulating layer 8 and the channel region 1C in the substrate.

Subsequently and as shown in FIG. 3A-FIG. 3F, a metal gate stack structure 9 is formed in the PMOS gate trench and the NMOS gate trench, respectively. In FIG. 3A-FIG. 3F, the left portion shows a locally enlarged view (the sectional view along the first direction) of the region shown within the broken line in FIG. 2 in the NMOS region and the right portion shows a locally enlarged view (the sectional view along the first direction) of the region shown within the broken line in FIG. 2 in the PMOS region.

In particularly and as shown in FIG. 3A, a first barrier layer 9A, an etching stop layer 9B, and a sacrificial layer 9C are deposited in turn on the gate insulating layer 8 within the NMOS gate trench and the PMOS gate trench. For example, the deposition process may be PECVD, HDPCVD, MOCVD, MBE, ALD, Evaporation, Sputtering or the like. The materials for the first barrier layers 9A for the NMOS region and the PMOS region are identical to each other, e.g. TiN. Preferably, the thickness of the first barrier layer 9A is small, for example, 1-5 nm, as long as it may prevent the light weight ion such as Al or the like in the NMOS region from diffusing into the underlying gate insulating layer 8 and then diffusing into the channel region 1C. Moreover, the first barrier layer 9A simultaneously functions as an adhesive layer so as to enhance the adhesiveness between the respective metal layers and the underlying high-K dielectric layer 8. Subsequently, similar processes are utilized to deposit an etching stop layer 9B on the first barrier layer 9A within the NMOS gate trench and the PMOS gate trench. The material of the etching stop layer 9B may be TaN and the thickness of the etching stop layer 9B is greater than that of the layer 9a, e.g. 2-10 nm, so as to protect the first barrier layer 9A from being over etched during the subsequent etching. Subsequently, similar processes are utilized to deposit a sacrificial layer 9C on the etching stop layer 9B within the NMOS gate trench and the PMOS gate trench, so as to provide a temporary residence for the dopant during the subsequent ion implantation doping and diffusion process. The material for the layer 9C may be selected from a group consisting of polycrystalline silicon, amorphous silicon, amorphous germanium, SiGe, Si:C, and Si:H or the like with a greater thickness such as 10-50 nm so as to receive sufficient dopant ions.

Subsequently and as shown in FIG. 3B, ion implantations are performed on the sacrificial layer 9C exposed in the NMOS gate trench and the sacrificial layer 9C exposed in the PMOS gate trench, respectively, so as to dope different dopants for adjusting the threshold voltage. In one preferred embodiment of the present disclosure, the same doping ions are implanted for the NMOS and PMOS regions so that their work functions shift to the same direction (towards conduction band or valence band). For example, the doping ions may be of the same types and may be selected from a group consisting of B, Al, Ga, C, Be, Ca, As, P, N, Ge, Sb, Se, and Te, or any combination thereof. For example in one preferred embodiment of the present disclosure, different types of impurities are doped into the NMOS region and the PMOS region so that the fine tuning direction of the work function are different (one of which shifts towards the conduction band and the other of which shifts towards the valence band). In particular, a photoresist pattern is utilized to cover the NMOS gate trench and to expose the PMOS gate trench only. Subsequently, the sacrificial layer 9C in the PMOS gate trench is doped with an impurity such as As, P, N, Ge, Sb, Se, Te or any combination thereof. Subsequently, the photoresist pattern is utilized to cover the PMOS gate trench and to expose the NMOS gate trench only. The sacrificial layer 9C exposed in the NMOS gate trench is doped with impurity such as B, Al, Ga, C, Be, Ca, or any combination thereof. Moreover, in another embodiment of the present disclosure, the NMOS region and the PMOS region are doped with the same impurity so that their work functions shift to the same direction (e.g. conduction band or valence band). However, the particular impurities doped into the NMOS region and the PMOS region are different so that the shift amounts are different.

Subsequently and as shown in FIG. 3C, a process such as laser annealing, RTA annealing, hot stove annealing or the like is utilized to activate the doped ions and to drive the dopant to diffuse downwards through the etching stop layer 9B into the first barrier layer 9A, so that a majority of the dopants are accumulated in the sacrificial layer 9C and the first barrier layer 9A of TiN (for example, as shown in FIG. 3 by the deep gray region, which is only used to represent the relative concentration and is not used to limit the numeral value of its absolute concentration), and only a fraction of the dopants are reserved in the etching stop layer 9B (for example, as shown in FIG. 3 by the light gray region, which is only used to represent a relative concentration and is not used to limit the numeral value of its absolute concentration; and for example, it is lower than those of the layers 9A and 9C by two orders of magnitude). During such a process, the annealing temperature may be controlled to be within 850-1050 Celsius degrees and the annealing time is controlled to be within 1-30 s, so as to accurately control the distribution of the dopants and to prevent the dopants from travelling through the barrier layer 9A into the gate insulating layer 8 of a high-k material, and meanwhile to drive the peak depth of the distribution to travel through the layer 9B and into the layer 9A. It should be noted that although FIG. 3B and FIG. 3C show a diffusion process in which an ion implantation is performed first and then the annealing is performed, it may form in situ a doped sacrificial layer 9C by adding a raw gas (e.g. gases of Borane, Phosphine, Arsine, gas of nitrogen oxide, steam of metalorganics and so on) during the process of depositing a sacrificial layer 9C in FIG. 3A without utilizing the ion implantation in FIG. 3B but by directly utilizing the annealing in FIG. 3C so that the in situ doped dopants diffuse downwards. The annealing process in FIG. 3C may be combined with a deposition process in which the raw gas is stopped being fed into the reactive cavity and a high temperature is maintained for a corresponding time).

Figure 3D:
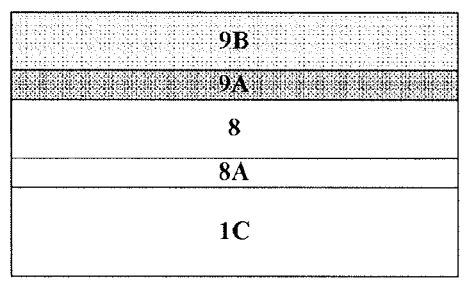
Figure 3D:
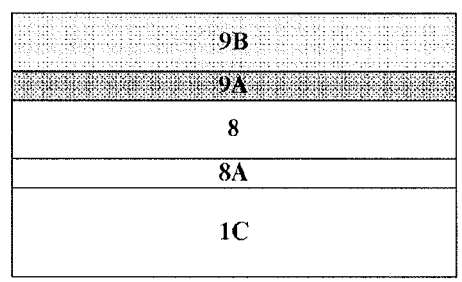

Subsequently and as shown in FIG. 3D, all of the sacrificial layers 9C in the NMOS gate trench and the PMOS gate trench are selectively etched off. The material of polycrystalline silicon, amorphous silicon and Si:H may be removed by a TMAH wet etching and the material of SiGe, Si:C, and amorphous germanium may be removed by anisotropic dry etching process (the etching gas may comprise halogen-based gases such as fluorocarbon based gas and chlorine gas and optional oxidizing gas). Since there are distinct difference between the materials of the etching stop layer of TaN, the first barrier layer of TiN, and that of the sacrificial layer 90. The etching may be automatically stopped on top of the layer 9B and the layer 9C is completely removed. The ions are doped in this way.

Figure 3E:
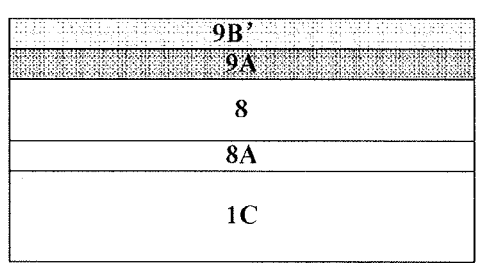
Figure 3E:
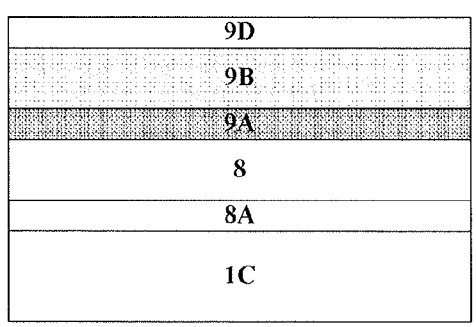

Subsequently and as shown in FIG. 3E, the thicknesses of the respective layers in the NMOS gate trench and the PMOS gate trench are adjusted so as to further finely adjust the work function and the threshold voltage. In one preferred embodiment of the present disclosure, a PMOS work function adjusting layer 9D of TiN material (e.g. the thickness of which is identical to that of the layer 9A) is firstly deposited in the NMOS gate trench and the PMOS gate trench; then a photoresist pattern is utilized to cover the PMOS gate trench and to expose the NMOS gate trench only; the PMOS work function adjusting layer 9d in the NMOS gate trench is removed by etching until the etching stop layer 9B is exposed. During such a process, the etching stop layer 9B in the NMOS gate trench may be over etched and its thick is decreased, so that the thickness of the remaining etching stop layer 9B' is reduced by about 1-3 nm. Moreover, in another preferred embodiment of the present disclosure, a photoresist pattern is utilized to cover the NMOS gate trench and to expose the PMOS gate trench only; then, a PMOS work function adjusting layer 9D of TiN is deposited in the exposed PMOS gate trench by a process such as PECVD, HDPCVD, MBE, MOCVD, ALD or the like. Thus, the reduction of the thickness of the etching stop layer 9B may be avoided and the layer 9B may be even completely removed.

Figure 3F:
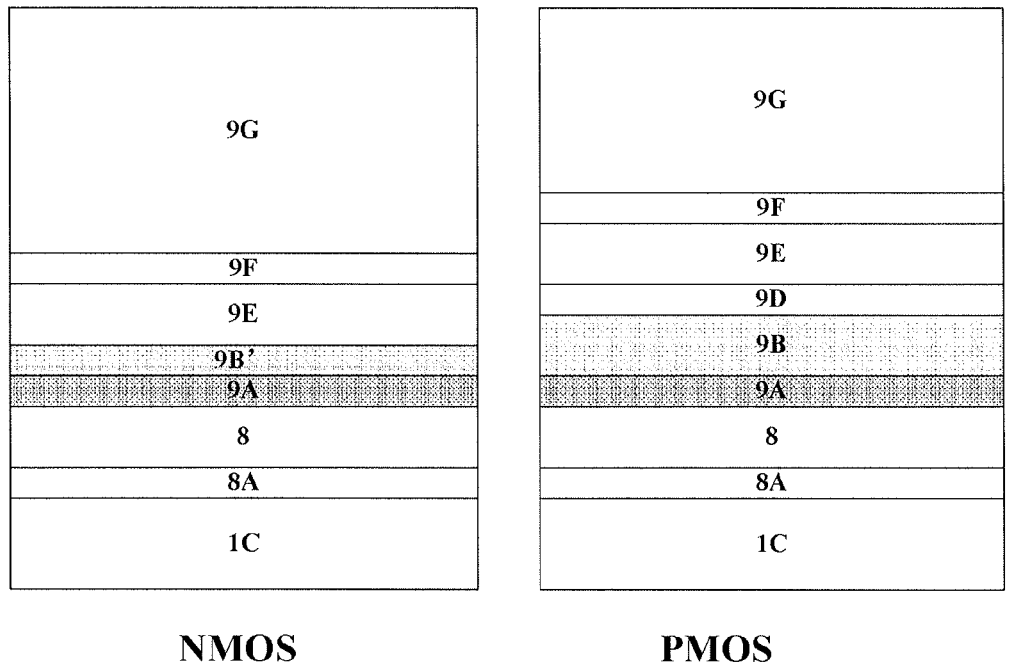

Finally, as shown in FIG. 3F, an NMOS work function adjusting layer 9E, a second barrier layer 9f, and a filling layer 9G are deposited in turn in all of the NMOS gate trenches and all of the PMOS gate trenches. The deposition process preferably selects a process with a better step coverage, such as HDPCVD, MBE, ALD, or the like. The material of the NMOS work function adjusting layer 9E may be TiAl, TiC, TiAlC, or any combination thereof, and its thickness is normally greater than those of the layer 9A and 9b, e.g. about 10-50 nm. The second barrier layer 9F is used to prevent the light weight atoms such as Al, C, or the like in the NMOS work function adjusting layer from diffusing upwards and facilitates in enhancing an adhesive force between the lower layer 9E/9D and the upper filling layer 9G. The material of the second barrier layer 9F may be TiN and function as a second portion of the work function adjusting layer for the PMOS device in the PMOS region (the first portion is the layer 9D, and the layer 9F may be called as the second PMOS work function adjusting layer). The thickness of the layer 9G is relatively great, e.g. about 30-500 nm and the material of the layer 9G preferably may be a metal with a lower resistivity and a higher filling rate, such as a pure metal of Co, Ni, Cu, Al, Pd, Pt, Ru, Re, Mo, Ta, Ti, Hf, Zr, W, Ir, Eu, Nd, Er, La or the like, alloys of these metals, or nitrides of these metals. Preferably, the planarization of the CMP make the top of the metal gate structure 9 flushing, e.g. until the ILD layer 5B in FIG. 2 is exposed. It should be noted that since a portion of the etching stop layer 9B in the NMOS gate trench is selectively removed and a (first) PMOS work function adjusting layer 9D is additionally deposited in the PMOS gate trench, the filling thickness of the filling layer 9G in the NMOS gate trench is greater than that of the filling layer in the PMOS gate trench, which may further reduce the contact resistance of the NMOS gate and improve the electrical property of the NMOS device.

Subsequently, an interconnection of the device may be accomplished by a conventional process. For example, the ILD layer 5B and the contact etching stop layer 5A are etched in turn until the raised source/drain region 1 HS/1 HD is exposed to form a contact via. Preferably, the etching method may select an anisotropic dry etching, such as plasma etching or RIE. Preferably, a metal silicide (not shown) is formed on the source/drain region exposed by the contact via to decrease the contact resistance. For example, a metal layer (not shown) is formed in the contact via by evaporation, sputtering, MOCVD, MBE, ALD or the like, and the material for the metal layer may be a metal such as Ni, Pt, Co, Ti, W, or the like, or alloys of these metals. An annealing is performed at a temperature of about 250-1000 Celsius degrees for about 1 ms-10 min so that the metal or metal alloy reacts with the Si element contained in the source/drain region to form a metal silicide and to decrease the contact resistance. Subsequently, a contact metal layer is filled into the contact via, for example, by a process such as MOCVD, MBE, ALD, Evaporation, sputtering, or the like to form the contact metal layer. Preferably, the material for the contact metal layer may be a material with a better ductility, a higher filling rate and a lower cost, e.g. a metal such as W, Ti, Pt, Ta, Mo, Cu, Al, Ag, Au, or the like, alloys of these metals and nitrides of these metals. Subsequently, a process such as CMP and etching back is used to planarize the contact metal layer until the CESL layer 5A is exposed.

A flowchart of the process according to one preferred embodiment of the present disclosure are illustrated by referring to the accompany FIG. 3A-FIG. 3F. However, the present disclosure may employ other order of the process. For example, the first barrier layer 9A, the etching stop layer 9B (the etching stop layer 9B is optional and may be omitted from this embodiment) and the sacrificial layer 9C are deposited in turn to be formed in the NMOS and PMOS gate trenches. Then, the sacrificial layer 9C is implanted by doping ions and annealed to drive the doping ions to diffuse into the first barrier layer 9A. Then, the sacrificial layer 9C is removed. A photoresist is filled in the NMOS gate trench so that only the first barrier layer 9A or the optional etching layer 9B in the PMOS gate trench is exposed. The PMOS work function adjusting layer 9D is deposited in the PMOS gate trench. Finally, similar to FIG. 3F, the NMOS work function adjusting layer 9E, the second barrier layer 9F, and the filling layer 9G are deposited to be formed in all of the NMOS gate trenches and the PMOS gate trenches.

It should be noted that the process of the present disclosure may be applied to a planar CMOS process. For example, a dummy gate stack is deposited on a bulk Si substrate; gate spacers and source/drain regions are formed on both sides of the dummy gate stack; an ILD layer is deposited on the whole substrate; the dummy gate stack is selectively etched off to remain a plurality of PMOS gate trenches and NMOS gate trenches in the ILD layer; and a gate insulating layer 8 of a high-K material is deposited in all of the gate trenches. Subsequently, by referring to the process shown in FIG. 3A-FIG. 3C, the first barrier layer 9A, the optional etching stop layer 9B, the NMOS work function adjusting layer 9C distributed only in the NMOS gate trench, the second barrier layer 9D, and the filling layer 9E are formed in the NMOS gate trenches and the PMOS gate trenches. By utilizing the second barrier on top of the NMOS and PMOS devices as the PMOS work function adjusting layer, the process is simplified to facilitate the adjustment of the threshold for different devices.

According to the semiconductor device and the method for manufacturing the same of the present disclosure, a sacrificial layer is utilized to diffuse impurity to the barrier layer, which effectively improves the adjusting accuracy of the threshold voltage and the property of the device as a whole.

The present disclosure has been described above with reference to one or more example embodiments. It should be understood that various suitable alternations and equivalents can be made to the device structure and/or process by one skilled person in the art without departing from the spirits and scope of the present disclosure. Moreover, the teachings of the present disclosure may make various modifications which may be adapted for particular situations or materials without departing from the spirits and scope of the present disclosure. Therefore, the object of the present disclosure is not limited to the above particular embodiments as preferably implementations of the present disclosure. The device structure and the manufacture method thereof as disclosed will include all of embodiments falling within the scope of the present disclosure.

What is claimed is:

1. A method for manufacturing a CMOS device, comprising steps of:
   forming a plurality of NMOS gate trenches and a plurality of PMOS gate trenches on a substrate;
   forming a gate insulating layer in each NMOS gate trench and each PMOS gate trench;
   forming a first barrier layer, an etching stop layer, and a sacrificial layer containing a dopant in turn on the gate insulating layer in the plurality of NMOS gate trenches and the plurality of PMOS gate trenches;
   performing an annealing to force the dopants in the sacrificial layer at least partially into the first barrier layer;
   selectively removing the sacrificial layer in the plurality of NMOS gate trenches and the plurality of PMOS gate trenches by etching;
   selectively depositing a PMOS work function adjusting layer in the plurality of PMOS gate trenches; and
   forming an NMOS work function adjusting layer, a second barrier layer, and a filling layer in turn in the plurality of NMOS gate trenches and the plurality of PMOS gate trenches.

2. The method for manufacturing a CMOS device according to claim 1, wherein the material for the sacrificial layer is selected from a group consisting of polycrystalline silicon, amorphous silicon, amorphous germanium, SiGe, Si:C, and Si:H, or any combination thereof.

3. The method for manufacturing a CMOS device according to claim 1, wherein the material for the first and/or second barrier and/or the PMOS work function adjusting layer is TiN.

4. The method for manufacturing a CMOS device according to claim 1, wherein the material for the NMOS work function adjusting layer comprises one of TiC, TiAl, and TiAlC or any combination thereof.

5. The method for manufacturing a CMOS device according to claim 1, wherein the step of depositing a PMOS work function adjusting layer specifically comprises steps of:
   depositing a PMOS work function adjusting layer in the plurality of NMOS gate trenches and the plurality of PMOS gate trenches;
   covering the plurality of PMOS gate trenches by a photoresist pattern; and
   removing the exposed PMOS work function adjusting layer in the plurality of NMOS gate trenches by etching until the etching stop layer is exposed or the etching stop layer is over etched.

6. The method for manufacturing a CMOS device according to claim 1, wherein the step of depositing a PMOS work function adjusting layer specifically comprise steps of:
   covering the plurality of NMOS gate trenches by a photoresist pattern; and depositing a PMOS work function adjusting layer on the exposed etching stop layer in the plurality of PMOS gate trenches.

7. The method for manufacturing a CMOS device according to claim 1, wherein the doping ion contained in the first barrier layer is selected from a group consisting of B, Al, Ga, C, Be, Ca, As, P, N, Ge, Sb, Se, and Te, or any combination thereof.

8. The method for manufacturing a CMOS device according to claim 1, wherein the step of forming a sacrificial layer containing a dopant comprises steps of:
    depositing a sacrificial layer on the etching stop layer, and selectively ion implanting different dopants into the plurality of NMOS gate trenches and the plurality of PMOS gate trenches; or
    depositing a sacrificial layer containing a dopant in situ by introducing a different raw doping gas when the sacrificial layer is deposited.

9. The method for manufacturing a CMOS device according to claim 1, wherein the doping ion in the first barrier layer of the NMOS transistor and the PMOS transistor result in that the work function shifts towards one of a conduction band and a valence band, or that the work functions of the NMOS transistor and the PMOS transistor shift towards different directions or by different amounts.

* * * * *